United States Patent
Kwon et al.

(10) Patent No.: US 9,985,229 B2
(45) Date of Patent: May 29, 2018

(54) DIELECTRIC AND DIELECTRIC INK AND CAPACITOR AND TRANSISTOR AND DEVICE

(71) Applicant: Samsung Electronics Co., Ltd., Suwon-si, Gyeonggi-do (KR)

(72) Inventors: Youngnam Kwon, Gunpo-si (KR); Junghwa Kim, Yongin-si (KR); Jaewon Jang, Daegu (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 15/262,302

(22) Filed: Sep. 12, 2016

(65) Prior Publication Data
US 2017/0324050 A1    Nov. 9, 2017

(30) Foreign Application Priority Data
May 9, 2016 (KR) .................. 10-2016-0056268

(51) Int. Cl.
*H01L 29/08*  (2006.01)
*H01L 51/05*  (2006.01)
*H01G 4/04*   (2006.01)
*H01G 4/005*  (2006.01)
*H01L 29/51*  (2006.01)

(52) U.S. Cl.
CPC ........... *H01L 51/052* (2013.01); *H01G 4/005* (2013.01); *H01G 4/04* (2013.01); *H01L 29/51* (2013.01)

(58) Field of Classification Search
CPC .......... H01G 4/04; H01G 4/005; H01L 29/51
USPC ...................................................... 257/40
See application file for complete search history.

(56) References Cited

U.S. PATENT DOCUMENTS

| 4,453,126 A | * | 6/1984 | Volgyesi | G01N 27/227 324/663 |
| 5,082,627 A | * | 1/1992 | Stanbro | G01N 27/221 324/658 |
| 6,387,614 B1 | | 5/2002 | Cheng et al. | |
| 7,745,856 B2 | | 6/2010 | Noy et al. | |
| 8,377,706 B2 | | 2/2013 | Hong et al. | |
| 9,018,740 B2 | | 4/2015 | Charrier et al. | |

(Continued)

FOREIGN PATENT DOCUMENTS

| KR | 10-1110805 B1 | 2/2012 |
| KR | 10-1587550 B1 | 1/2016 |

OTHER PUBLICATIONS

Tuyen D. Nguyen et al., "A field effect transistor biosensor with a y-pyrone derivative engineered lipid-sensing layer for ultrasensitive Fe3+ ion detection with low pH interference", Biosensors and Bioelectronics, 54, 2014, pp. 571-577.

(Continued)

*Primary Examiner* — Long K Tran
(74) *Attorney, Agent, or Firm* — Harness, Dickey & Pierce, P.L.C.

(57) ABSTRACT

A dielectric and a dielectric ink include a dielectric material. The dielectric material includes ceramide or a ceramide derivative. A capacitor and a transistor may include the dielectric material. A device may include at least one of a capacitor and a transistor that includes the dielectric material. A dielectric that includes ceramide or a ceramide derivative may be configured to provide dielectric performance in a bio field. The effect on a human body by the dielectric may be reduced, based on the dielectric material of the dielectric including ceramide or a ceramide derivative.

17 Claims, 5 Drawing Sheets

(56) References Cited

U.S. PATENT DOCUMENTS

| | | | | |
|---|---|---|---|---|
| 2002/0127734 | A1* | 9/2002 | Huebner | G01N 21/77 436/164 |
| 2010/0072976 | A1 | 3/2010 | Sheu et al. | |
| 2011/0229417 | A1* | 9/2011 | Gurge | A61K 9/0014 424/45 |
| 2014/0264473 | A1* | 9/2014 | Charrier | G01N 27/414 257/253 |

OTHER PUBLICATIONS

K.S. Narayan et al., "Water-Gated Phospholipid-Monolayer Organic Field Effect Transistor Through Modified Mueller-Montal Method", IEEE Electron Device Letters, vol. 34, No. 2, Feb. 2013.

Serafina Cotrone et al., "Phospholipid film in electrolyte-gated organic field-effect transistors", Organic Electronics, 13, Jan. 24, 2012, pp. 638-644.

Quanming Shi et al., "Rapid disorganization of mechanically interacting systems of mammary acini", PNAS, vol. 111, No. 2, Jan. 14, 2014, pp. 658-663.

Moumita Mukherjee et al., "Investigation of organic n-type field-effect transistor performance on the polymeric gate dielectrics", Synthetic Metals, 160, Jan. 12, 2010, pp. 504-509.

Jer-Wei Chang et al., "Chicken Albumen Dielectrics in Organic Field-Effect Transistors", Advanced Materials, 23, 2011, pp. 4077-4081.

Suk-Won Hwang et al., "25th Anniversary Article: Materials for High-Performance Biodegradable Semiconductor Devices", Advanced Materials, 26, 2014, pp. 1992-2000.

Richard H. Quarles et al., "Myelin Formation, Structure and Biochemistry", American Society for Nuerochemistry, 2006, pp. 51-71.

Johannes Kornhuber et al., "The ceramide system as a novel antidepressant target", Trends in Pharmacological Sciences, Jun. 2014, vol. 35, No. 6, pp. 293-304.

* cited by examiner

DIELECTRIC AND DIELECTRIC INK AND CAPACITOR AND TRANSISTOR AND DEVICE

CROSS REFERENCE TO RELATED APPLICATIONS

This application claims priority to and the benefit of Korean Patent Application No. 10-2016-0056268 filed in the Korean Intellectual Property Office on May 9, 2016, the entire contents of which are incorporated herein by reference.

BACKGROUND

1. Field

Example embodiments relate to a dielectric, a dielectric ink, a capacitor, a transistor, and a device.

2. Description of the Related Art

A capacitor or a transistor may include a dielectric. For example, a capacitor may include two conductors and a dielectric therebetween, and a transistor may include a dielectric between a gate electrode and a semiconductor. The performance of the capacitor or the transistor may be affected by the dielectric.

In some cases, a device in a bio field such as a bio sensor also requires bio-friendly characteristics. For example, a dielectric included in a device configured to be used in a bio field may be required to be configured to have a reduced effect on a human body, relative to other devices including dielectrics, as well as being configured to provide the dielectric performance of a dielectric.

SUMMARY

Some example embodiments provide a dielectric that is bio-friendly and having satisfactory dielectric characteristics, such that the dielectric is configured to provide electrical insulation and is further configured to be polarized by an applied electric field.

Some example embodiments provide a dielectric ink configured to form the dielectric that is bio-friendly and has satisfactory dielectric characteristics.

Yet some example embodiments provide a capacitor including the dielectric.

Still some example embodiments provide a transistor including the dielectric.

Some example embodiments provide a device including the capacitor or the transistor.

According to some example embodiments, a dielectric including ceramide or a ceramide derivative is provided.

The dielectric material may be a soluble material.

A dielectric constant of the dielectric material (e.g., a dielectric constant with which the dielectric material is associated) may be greater than or equal to about 9.0.

The dielectric may be a thin film having a thickness of less than or equal to about 50 nm.

According to some example embodiments, a dielectric ink including ceramide or a ceramide derivative and a solvent is provided.

The solvent may include chloroform, methanol, or a mixed solvent thereof.

The solvent may include a mixed solvent (e.g., "mixture") of chloroform and methanol and the mixed solvent may include about 80 to about 99 volume % of chloroform and about 1 to about 20 volume % of methanol.

According to some example embodiments, a capacitor includes a first electrode and a second electrode facing each other and a dielectric layer disposed between the first electrode and the second electrode and including the dielectric.

A dielectric constant of the dielectric layer may be greater than or equal to about 9.0.

An insulation breakdown electric field strength of the dielectric layer may be greater than or equal to about 7 MV/cm.

The dielectric layer may have a thickness of less than or equal to about 50 nm.

According to some example embodiments, a transistor includes a gate electrode, a semiconductor overlapping with the gate electrode, a gate dielectric layer between the gate electrode and the semiconductor and including the dielectric, and a source electrode and a drain electrode electrically connected with the semiconductor.

A dielectric constant of the gate dielectric layer may be greater than or equal to about 9.0.

An insulation breakdown electric field strength of the gate dielectric layer may be greater than or equal to about 7 MV/cm.

The gate dielectric layer may have a thickness of less than or equal to about 50 nm.

The semiconductor may be an organic semiconductor.

According to some example embodiments, a device includes the dielectric.

According to some example embodiments, a device includes the capacitor or the transistor.

The device may be a bio device, an electronic device, or an energy device.

A bio-friendly dielectric having satisfactory dielectric characteristics may be provided and thus effectively applied to various devices such as a bio device.

DETAILED DESCRIPTION

Hereinafter, example embodiments of the present disclosure will be described in detail, and may be easily performed by those who have common knowledge in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

As used herein, when a definition is not otherwise provided, the term 'substituted' refers to replacement of at least one hydrogen of a compound or a functional group by a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_{30}$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_3$ to $C_{30}$ heterocycloalkyl group, and a combination thereof.

As used herein, when specific definition is not otherwise provided, "hetero" refers to one including 1 to 3 hetero atoms selected from N, O, S, and P, and remaining carbons in one compound or substituent.

According to some example embodiments, a dielectric includes ceramide or a ceramide derivative (hereinafter, referred to as 'ceramide').

Ceramide is one of various fat components that may comprise a skin tissue and a cell membrane of an animal body or a human body and may be extracted from a brain or a skin of a cow, a pig, and the like or a skin of a plant such as soybean, wheat, rice, and the like, a bacteria, a prokaryote, a fungus, and the like or synthesized in accordance with various methods.

Ceramide may be an organic material including an amino alcohol connected with a linear alkyl chain as a main structure. For example, ceramide may include sphingosine, which is a linear alkyl amino alcohol having unsaturated hydrocarbon. In some example embodiments, the ceramide may have a structure that fatty acid is linked with a sphingosine chain through an amid bond and, for example, be represented by Formula 1, but is not limited thereto.

[Chemical Formula 1]

In Chemical Formula 1,
n is 4 to 20,
m is 0 or 1, and
each of $R^1$ to $R^3$ are independently hydrogen or a monovalent organic group, provided that $R^3$ does not include a phosphate group.

In some example embodiments, $R^1$ to $R^3$ of Chemical Formula 1 may independently be hydrogen, a substituted or unsubstituted $C_1$ to $C_{10}$ alkyl group, a substituted or unsubstituted $C_3$ to $C_{20}$ cycloalkyl group, a substituted or unsubstituted $C_3$ to $C_{20}$ heterocycloalkyl group, a substituted or unsubstituted $C_6$ to $C_{30}$ aryl group, or a substituted or unsubstituted $C_3$ to $C_{30}$ heteroaryl group, but are not limited thereto.

In some example embodiments, ceramide may be included in a dielectric for an electronic device due to insulating characteristics and high dielectric constant characteristics of the ceramide. In particular, the ceramide may have a reduced effect upon a human body, relative to other dielectric materials, as ceramide may be a bio compatible material variously usable as cosmetics and medicine and thus be effectively applied to a bio device.

The ceramide may include a soluble material. The ceramide may be prepared into a dielectric ink by using a solvent configured to reduce aggregates and ions. The solvent may be mixed with the ceramide to form the dielectric ink.

The dielectric ink may include ceramide and a solvent, and the solvent may include chloroform, methanol or a mixed solvent (e.g., a "mixture") thereof. The solvent may be, for example a mixed solvent of chloroform and methanol and the mixed solvent may include about 80 to about 99 volume % of chloroform and about 1 to about 20 volume % of methanol. Within the range, the mixed solvent may, for example, include about 90 to about 99 volume % of chloroform and about 1 to about 10 volume % of methanol and for example, about 95 volume % of chloroform and about 5 volume % of methanol.

The dielectric ink may include impurity ions including cations and anions in an extremely small amount of less than or equal to about 100 ppm, for example, less than or equal to about 80 ppm, for example, less than or equal to about 50 ppm. Accordingly, when the dielectric ink is applied to an electronic device, electrical characteristics of the dielectric ink and/or the electronic device may be limited and/or prevented from being deteriorated by the impurity ions.

The dielectric ink may be coated on a substrate or a lower layer and then dried and heat-treated to provide a dielectric, and may be for example coated by various coating methods of spin coating, slit coating, inkjet printing, bar coating, gravure printing, Stencil printing, and the like.

The dielectric ink may be applied in a form of a thin film having a thickness of, for example less than or equal to about 50 nm.

Figure 1:
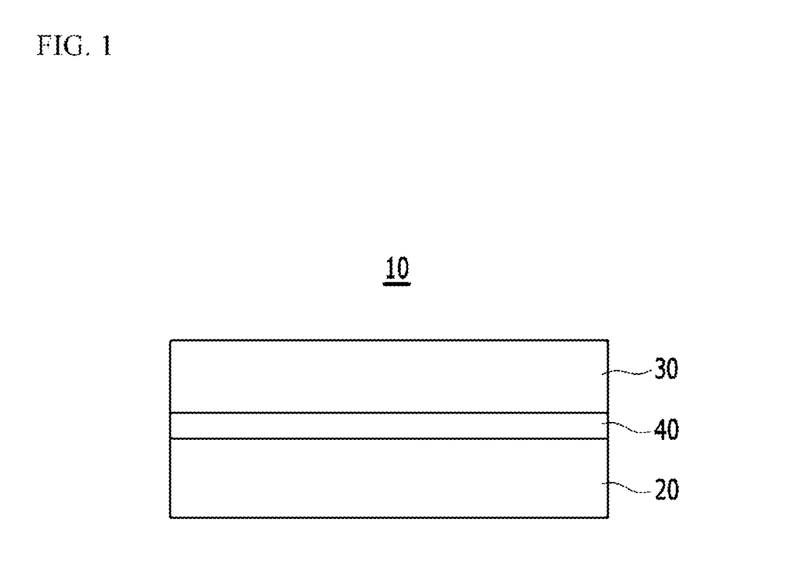
FIG. 1 is a schematic view showing a capacitor according to some example embodiments.

FIG. 1 is a schematic view showing a capacitor according to some example embodiments.

Referring to FIG. 1, a capacitor 10 according to some example embodiments includes a first electrode 20 and a second electrode 30 facing each other and a dielectric layer 40 between the first electrode 20 and the second electrode 30. In some example embodiments, the dielectric layer 40 includes at least one dielectric.

The first electrode 20 and the second electrode 30 may include a conductor including at least one of a metal, a conductive oxide, and/or a conductive polymer, and may be a single layer or a plural layer.

The dielectric layer 40 may include the ceramide and may be formed based on coating the dielectric ink on one of the electrodes 30 and 20, drying the dielectric ink, and heat-treating the dielectric ink. The dielectric ink may be formed into a uniform thin film due to high solubility of the ceramide and the very small amount of the impurity ions. For example, the dielectric layer 40 may have a surface roughness of less than or equal to about 5 nm (root mean square, RMS) when measured by an atomic force microscope (AFM), for example, less than or equal to about 3 nm, for example, less than or equal to about 2 nm within the ranges.

A dielectric constant of the dielectric layer 40 may be greater than or equal to about 3.0, for example greater than or equal to about 5.0, greater than or equal to about 7.0, greater than or equal to about 9.0, greater than or equal to about 12.0, or greater than or equal to about 14.0.

An insulation breakdown electric field strength of the dielectric layer 40 may be greater than or equal to about 7 MV/cm, for example greater than or equal to about 8 MV/cm, greater than or equal to about 9 MV/cm, or greater than or equal to about 10 MV/cm.

A leakage current of the dielectric layer 40 may be less than or equal to about $1\times10^{-6}$ A/cm$^2$, for example less than or equal to about $1\times10^{-7}$ A/cm$^2$, or less than or equal to about $1\times10^{-8}$ A/cm$^2$ at less than or equal to 1 MV/cm.

The dielectric layer 40 may be formed to have a thin thickness of less than or equal to about 50 nm, for example less than or equal to about 40 nm, less than or equal to about 30 nm, or less than or equal to about 20 nm.

The dielectric layer 40 may be a single layer or a plural layer.

Figure 2:
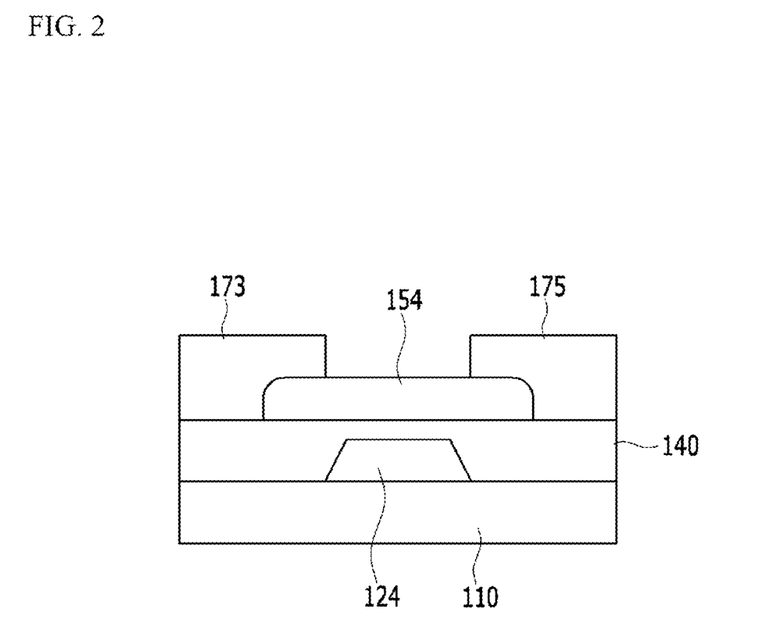
FIG. 2 is a schematic view showing a thin film transistor according to some example embodiments.

FIG. 2 is a schematic view showing a thin film transistor according to some example embodiments.

Referring to FIG. 2, a thin film transistor according to some example embodiments includes a gate electrode 124 formed on a substrate 110, a semiconductor 154 overlapping with the gate electrode 124, a gate dielectric layer 140 between the gate electrode 124 and the semiconductor 154, and a source electrode 173 and a drain electrode 175 electrically connected with the semiconductor 154.

The substrate 110 may at least partially comprise, for example, at least one of transparent glass, silicon, and a polymer. The gate electrode 124 is connected to a gate line (not shown) configured to transfer a gate signal, and may at least partially comprise, for example gold (Au), copper (Cu), nickel (Ni), aluminum (Al), molybdenum (Mo), chromium (Cr), tantalum (Ta), titanium (Ti), an alloy thereof, and a combination thereof, but is not limited thereto.

The semiconductor 154 may be an organic semiconductor or an inorganic semiconductor. The inorganic semiconductor may be, for example a silicon semiconductor or an oxide semiconductor. The organic semiconductor may be, for example, at least one selected from pentacene and a precursor thereof, tetrabenzoporphyrin and a derivative thereof, polyphenylene vinylene and a derivative thereof, polyfullerene and a derivative thereof, polythienylene vinylene and a derivative thereof, polythiophene and a derivative thereof, polythienothiophene and a derivative thereof, polyarylamine and a derivative thereof, phthalocyanine and a derivative thereof, metallized phthalocyanine or a halogenated derivative thereof, perylene tetracarboxylic dianhydride (PTCDA), naphthalene tetracarboxylic dianhydride (NTCDA), or an imide derivative thereof, perylene, or coronene, and substituent-containing derivatives thereof, but is not limited thereto.

The gate dielectric layer 140 may be formed from the dielectric ink, and may be, for example, formed by coating the dielectric ink, and drying and heat-treating the same. The dielectric ink may be formed into a uniform thin film due to high solubility of the ceramide and a very small amount of impurity ions in the ink. For example, the gate dielectric layer 140 may have a surface roughness of less than or equal to about 5 nm (RMS) when measured by an atomic force microscope, for example, less than or equal to about 3 nm, for example, less than or equal to about 2 nm within the ranges.

The gate dielectric layer 140 may include the above dielectric and exhibit satisfactory dielectric characteristics due to the ceramide having a high dielectric constant. As referred to herein, exhibiting satisfactory dielectric characteristics may include being configured to provide electrical insulation and being further configured to be polarized by an applied electric field.

A dielectric constant of the gate dielectric layer 140 may be greater than or equal to about 3.0, for example greater than or equal to about 5.0, greater than or equal to about 7.0, greater than or equal to about 9.0, greater than or equal to about 12.0, or greater than or equal to about 14.0.

An insulation breakdown electric field strength of the gate dielectric layer 140 may be greater than or equal to about 7 MV/cm, for example greater than or equal to about 8 MV/cm, greater than or equal to about 9 MV/cm or greater than or equal to about 10 MV/cm.

A leakage current of the gate dielectric layer 140 may be less than or equal to about $1\times10^{-6}$ A/cm$^2$, for example less than or equal to about $1\times10^{-7}$ A/cm$^2$ or less than or equal to about $1\times10^{-8}$ A/cm$^2$ at less than or equal to 1 MV/cm.

The gate dielectric layer 140 may be formed to have a thin thickness of less than or equal to about 50 nm, for example less than or equal to about 40 nm, less than or equal to about 30 nm, or less than or equal to about 20 nm. In this way, the thin gate dielectric layer 140 may lower a driving voltage of a thin film transistor.

The source electrode 173 and the drain electrode 175 face each other with the semiconductor 154 therebetween, and are electrically connected with the semiconductor 154. The source electrode 173 is electrically connected to the data line (not shown) transferring the data signal. The source electrode 173 and the drain electrode 175 may at least partially comprise gold (Au), copper (Cu), nickel (Ni), aluminum (Al), molybdenum (Mo), chromium (Cr), tantalum (Ta), titanium (Ti), an alloy thereof, or a combination thereof, but are not limited thereto.

Herein, a capacitor and a transistor are exemplarily illustrated, but the dielectric may be applied to any device requiring dielectric characteristics.

The aforementioned dielectric material, capacitor, or thin film transistor may be for example applied to various devices such as a bio device, an electronic device, an energy device, or the like, for example, a semiconductor device, a flat panel display, a battery, a FET bio sensor, an organic sensor, and an image sensor.

In particular, as described above, a dielectric material that includes ceramide or a ceramide derivative as a bio compatible material may have a reduced effect upon a human body, relative to other dielectric materials, and thus may be effectively applied to a patch-type or implantable bio device for diagnosing and treating a disease.

For example, when the thin film transistor is applied to a FET bio sensor, a probe biomolecule may be in-vitro or in-vivo attached to the gate electrode 124 and change a current passing the semiconductor 154 depending on an amount of a target living molecule attached to the gate electrode 124 to sense the living molecule by using this current change.

Hereinafter, the present disclosure is illustrated in more detail with reference to examples. However, these examples are exemplary, and the present disclosure is not limited thereto.

Preparation of Dielectric Ink

Preparation Example 1

A transparent dielectric ink may be prepared by preparing ceramide (CAS No. 85305-88-0, Chemical Name: GALACTOCEREBROSIDES from Bovine spinal cord 50 mg, Lot KPK 2807, made by Wako Pure Chemical Industries, Ltd., Japan), adding 25 mg of the ceramide to 5 ml of a mixed solvent of chloroform/methanol (95:5 v/v) (4.75 ml of chloroform+0.25 ml methanol), and ultrasinicating the mixture with a sonicatior (Branson 5510) for 30 minutes at room temperature, and then, examining its turbidity with naked eyes.

Analysis

The impurity concentration of the dielectric ink according to Preparation Example 1 is examined.

The impurity concentration is examined through ion exchange chromatography by using a Dionex ICS-5000 DP analyzer.

The ion chromatography separates ions depending on the number of charges that the ions have and a degree that the ions become hydrated, and a degree that the ions are exchanged according to polarization capability, while the ions for analysis are passed through an ion exchange resin charged in a column. The most used ion exchange resin is obtained by binding a functional group such as sulfonic acid or amine with a polystyrene polymer obtained by using styrene and divinyl benzene as raw materials. The ion exchange resin may be classified into an anion exchange resin used for an anion analysis and a cation exchange resin for a cation analysis.

The results are shown in Table 1.

TABLE 1

| | Concentration (ppm) | | Concentration (ppm) |
|---|---|---|---|
| $Na^+$ | 29.6 | $NO_3^-$ | 2.5 |
| $NH_4^+$ | 2.7 | $SO_4^{2-}$ | 10.4 |
| $Li^+$ | 0 | $Cl^-$ | 2.5 |
| $Mg^{2+}$ | 0 | $F^-$ | 0 |
| $Ca^{2+}$ | 0 | $Br^-$ | 0 |
| $K^+$ | 0 | | |

Referring to Table 1, the dielectric ink according to Preparation Example 1 includes impurities in a very small concentration of less than or equal to about 100 ppm and thus has a high purity.

Manufacture of Capacitor

Example 1

A lower electrode is formed by sputtering molybdenum (Mo) on a substrate. Subsequently, on the lower electrode, the dielectric ink according to Preparation Example 1 is spin-coated at 500 rpm for 40 seconds, dried on a 70° C. hot plate for 1 minute (repetitively 5 times), and heat-treated at 100° C. for 30 minutes (repetitively 5 times) to form a 20 µm-thick dielectric layer. Then, on the dielectric layer, gold (Au) is sputtered to form an upper electrode and finally, manufacture a capacitor.

Evaluation 1

Surface roughness of the dielectric layer in the capacitor according to Example 1 is evaluated.

The surface roughness of 2.5×2.5 cm$^2$ of the dielectric layer at four corners of the capacitor according to Example 1 was measured by using an atomic force microscope (Dimension Icon model, Bruker).

Figure 3:
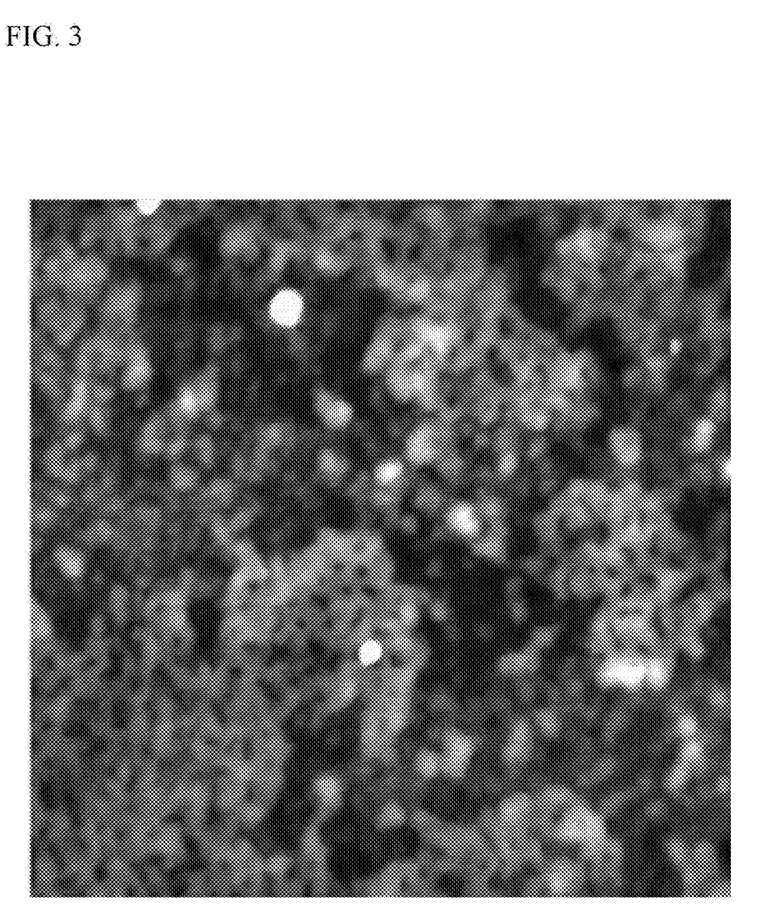
FIG. 3 is an atomic force microscope photograph showing the surface of a dielectric layer in a capacitor according to some example embodiments.

FIG. 3 is an atomic force microscope photograph showing the dielectric layer in the capacitor according to Example 1.

The capacitor of Example 1 has surface roughness of about 1.78 nm (RMS) and the dielectric layer coated with a uniform dielectric ink and having satisfactory quality.

Evaluation 2

Dielectric constant, insulation strength, and leakage current of the capacitor according to Example 1 are evaluated.

Figure 4:
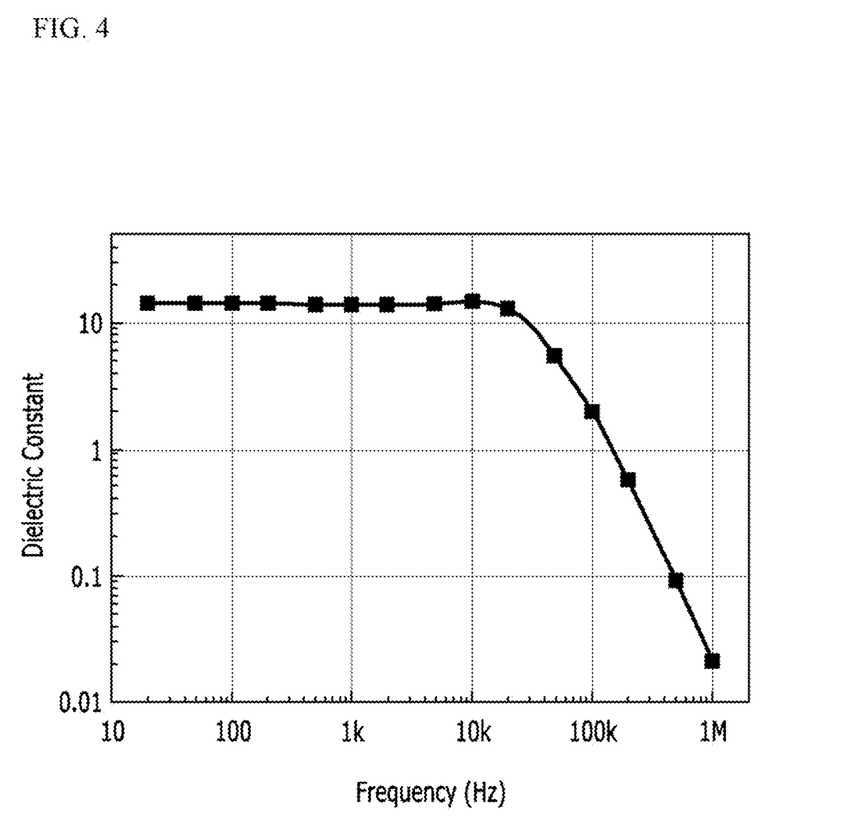
FIG. 4 is a graph showing a dielectric constant of a capacitor according to some example embodiments.
Figure 5:
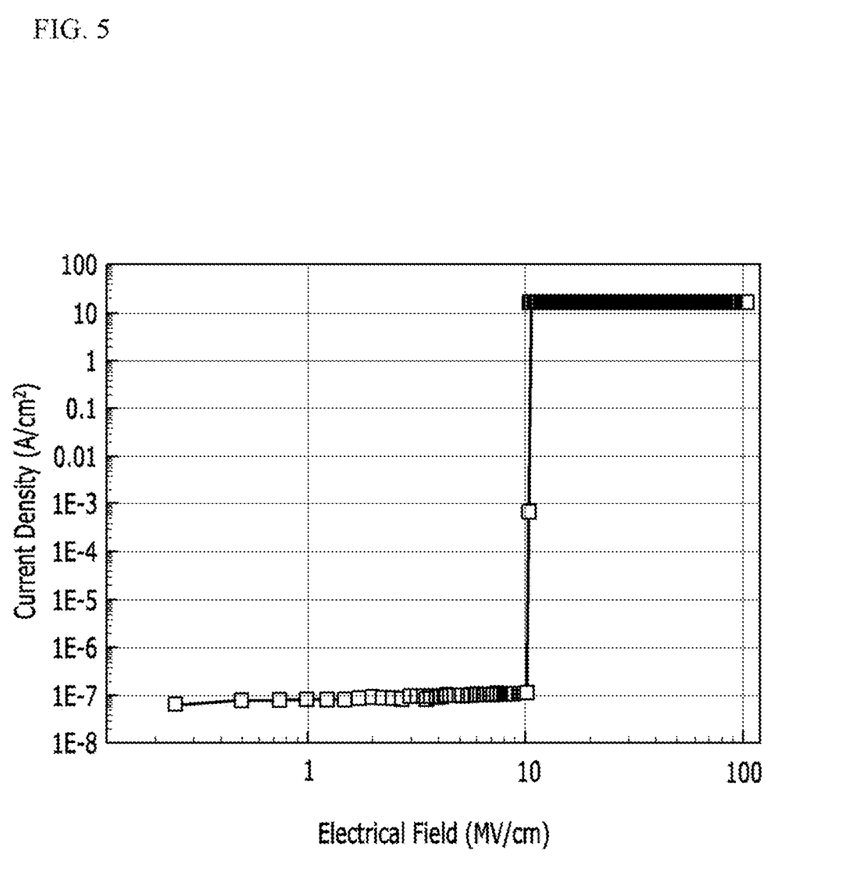
FIG. 5 is a graph showing current density of a capacitor according to some example embodiments.

FIG. 4 is a graph showing dielectric constant of the capacitor of Example 1 depending on frequency, according to some example embodiments, and FIG. 5 is a graph showing current density of the capacitor of Example 1 depending on a voltage, according to some example embodiments.

Referring to FIG. 4, the capacitor of Example 1 exhibits a dielectric constant of about 14.4 within a low frequency range and maintains the same dielectric constant up to about 10 kHz.

Referring to FIG. 5, the capacitor of Example 1 exhibits a leakage current of about $1 \times 10^{-8}$ A/cm$^2$ at less than or equal to 1 MV/cm and an insulation breakdown electric field strength of about 10 MV/cm.

Accordingly, the capacitor of Example 1 exhibits a high dielectric constant and a low leakage current, which confirms dielectric characteristics of the dielectric layer including ceramide.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A dielectric, comprising:
    a dielectric material including one material of ceramide or a ceramide derivative, the one material having a structure that fatty acid is linked with a sphingosine chain through an amid bond,
    wherein a dielectric constant of the dielectric material is greater than or equal to about 9.0.

2. The dielectric of claim 1, wherein the dielectric material is a soluble material.

3. The dielectric of claim 1, wherein the dielectric is a thin film having a thickness of less than or equal to about 50 nm.

4. A capacitor, comprising:
    a first electrode and a second electrode; and
    a dielectric layer between the first electrode and the second electrode, the dielectric layer including the dielectric of claim 1.

5. The capacitor of claim 4, wherein the dielectric layer is associated with an insulation breakdown electric field strength that is greater than or equal to about 7 MV/cm.

6. The capacitor of claim 4, wherein the dielectric layer has a thickness of less than or equal to about 50 nm.

7. A device, comprising:
    the capacitor of claim 4.

8. A transistor, comprising:
    a gate electrode;
    a semiconductor overlapping with the gate electrode;
    a gate dielectric layer between the gate electrode and the semiconductor, the gate dielectric layer including the dielectric of claim 1; and
    a source electrode and a drain electrode electrically connected with the semiconductor.

9. The transistor of claim 8, wherein the gate dielectric layer is associated with an insulation breakdown electric field strength that is greater than or equal to about 7 MV/cm.

10. The transistor of claim 8, wherein the gate dielectric layer has a thickness of less than or equal to about 50 nm.

11. The transistor of claim 8, wherein the semiconductor is an organic semiconductor.

12. A device, comprising:
    the transistor of claim 8.

13. A device, comprising:
    the dielectric of claim 1.

14. A dielectric ink, comprising:
    a dielectric material including one material of ceramide or a ceramide derivative, the one material having a structure that fatty acid is linked with a sphingosine chain through an amid bond; and
    a solvent,
    wherein a dielectric constant of the dielectric material is greater than or equal to about 9.0.

15. The dielectric ink of claim 14, wherein the solvent includes at least one of chloroform and methanol.

16. The dielectric ink of claim 15, wherein,
    the solvent includes a mixture of chloroform and methanol; and
    the mixture includes about 80 to about 99 volume % of chloroform and about 1 to about 20 volume % of methanol.

17. The dielectric ink of claim 14, wherein the dielectric ink includes impurity ions, such that a concentration of impurity ions in the dielectric ink is less than or equal to about 100 ppm.

* * * * *